(12) United States Patent
Abel et al.

(10) Patent No.: US 7,352,313 B2
(45) Date of Patent: Apr. 1, 2008

(54) METHOD AND APPARATUS FOR MASTER/SLAVE DIGITAL-TO-ANALOG CONVERSION

(75) Inventors: Christopher J. Abel, Coplay, PA (US); Peter C. Metz, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/141,498

(22) Filed: May 31, 2005

(65) Prior Publication Data

US 2006/0267824 A1  Nov. 30, 2006

(51) Int. Cl.
*H03M 1/66* (2006.01)
(52) U.S. Cl. .................. 341/145; 341/144
(58) Field of Classification Search ......... 341/140–170
See application file for complete search history.

(56) References Cited

U.S. PATENT DOCUMENTS

| | | | | |
|---|---|---|---|---|
| 4,998,108 | A * | 3/1991 | Ginthner et al. | 341/145 |
| 5,270,716 | A * | 12/1993 | Gleim | 341/145 |
| 5,451,946 | A * | 9/1995 | Smith et al. | 341/145 |
| 5,489,904 | A * | 2/1996 | Hadidi | 341/145 |
| 6,114,980 | A * | 9/2000 | Tilley et al. | 341/118 |
| 6,281,652 | B1 * | 8/2001 | Ryan et al. | 341/144 |
| 6,304,119 | B1 * | 10/2001 | Tseng et al. | 327/161 |
| 6,313,775 | B1 * | 11/2001 | Lindfors et al. | 341/144 |
| 6,329,941 | B1 * | 12/2001 | Farooqi | 341/145 |
| 6,515,606 | B2 * | 2/2003 | Lyden | 341/144 |
| 6,549,155 | B1 * | 4/2003 | Heminger et al. | 341/144 |
| 6,556,162 | B2 * | 4/2003 | Brownlow et al. | 341/145 |
| 6,791,607 | B1 * | 9/2004 | Bilhan et al. | 348/243 |
| 6,970,121 | B1 * | 11/2005 | Sun | 341/144 |

FOREIGN PATENT DOCUMENTS

EP   WO 2005/107078 A1 *   5/2005   ............ 34/144

* cited by examiner

*Primary Examiner*—Lam T. Mai

(57) ABSTRACT

Methods and apparatus are provided for improved digital-to-analog conversion. The disclosed digital-to-analog converter comprises a master digital-to-analog converter that generates a master analog value, and a slave digital-to-analog converter that generates a slave analog value that is based on the master analog value. The slave analog value can be, for example, substantially proportional to the master analog value. The master D/A converter can be varied during a coarse tuning mode, while the input to the slave D/A can be fixed, for example, to an approximately mid-range value until the master analog value satisfies one or more predefined conditions. Thereafter, during a fine tuning mode, the slave D/A converter can be varied, while the master D/A converter is fixed, so that the output Y is equal to a desired value (within a specified tolerance).

20 Claims, 1 Drawing Sheet

CONTROLLED DELAY-LINE TRANSFER CHARACTERISTIC

METHOD AND APPARATUS FOR MASTER/SLAVE DIGITAL-TO-ANALOG CONVERSION

FIELD OF THE INVENTION

The present invention is related to digital-to-analog conversion techniques, and is applicable to the digital control of certain types of analog systems.

BACKGROUND OF THE INVENTION

Digital-to-analog conversion is required for many applications, including clock and data recovery (CDR) applications for digital communications. FIG. 1 is a block diagram of a conventional digital-to-analog (D/A) converter 100. As shown in FIG. 1, a digital-to-analog converter 100 translates a given digital word into an analog electrical signal, for example a voltage or a current. In a Phase Locked Loop (PLL) (or a Delay Locked Loop (DLL)), for example, a digital-to-analog converter 100 may convert a digital word representing a phase offset or time delay into an analog bias signal that controls the phase (or delay) of a clock signal.

In general, the value of the analog output, Y, of a typical D/A converter with an N-bit binary input word is a fraction of a full-scale output value, this fraction being defined by the value of the binary input. Specifically, for an exemplary digital-to-analog converter 100, the analog output, Y, is equal to $$Y = \left(\frac{X}{2^N}\right) Y_{MAX} \qquad (1)$$

where $Y_{MAX}$ is the full-scale value of the D/A converter, and X is the decimal equivalent of the binary input word. For example, suppose that N equals 6, and that the D/A converter 100 generates a current with a full-scale value of 1 mA. If the digital input word is set to 100000, i.e., the binary representation of 32, then the output current of the D/A converter will be equal to 0.5 mA ((1 mA)×(32/64)). Similarly, if the digital input word is set to 010000, then the output current would be equal to 0.25 mA ((1 mA)×(16/64)).

When the binary input to the D/A converter 100 increments or decrements by 1, the output, Y, changes by an amount equal to $Y_{MAX}/2^N$, which is known as the step size of the D/A converter. The step size represents the maximum value of the error that occurs if the analog output of the D/A converter is used to approximate a continuously valued analog signal. This error, known as quantization error, must be taken into account in the design of any system that uses a D/A converter. In a standard D/A converter with a specified output range, the step size can only be reduced by increasing N, which results in an increase in the size, complexity, and cost of the converter.

The step size of a conventional D/A converter is constant; thus, a single step change results in a much higher percentage change in the analog output, Y, near the low end of the D/A output range than it does at the high end of the range. For example, suppose that a given application requires the output of the D/A converter 100 to cover the range of $0.1 \times Y_{MAX}$ to $0.9 \times Y_{MAX}$, while also requiring that the step size be no larger than 1% of the instantaneous value of the output over the specified output range. Then, the step size of the D/A converter 100 must be no larger than $0.001 \times Y_{MAX}$, which would require the D/A converter 100 to be at least a 10-bit converter. Furthermore, when Y is close to the upper end of the specified output range, the step size would be significantly smaller than required by the specification. Thus, in many applications, the step size of a conventional D/A converter, and thus the complexity of the circuit, is set by the precision required at the low end of the output range.

In many applications in which quantization error must be very small, the number of bits, N, in the digital control word of the conventional D/A converter would have to be quite large. In many such applications, it may be possible to first perform a coarse adjustment of the analog output signal, Y, and then when the value of this signal is within a predefined tolerance of a desired value, to perform either a one-time or a continuous fine adjustment of the analog output signal, Y.

A need therefore exists for improved techniques for digital-to-analog conversion. A further need exists for a digital-to-analog converter that is comprised of two or more digital-to-analog converters that may each be employed during different operating modes.

SUMMARY OF THE INVENTION

Generally, methods and apparatus are provided for improved digital-to-analog conversion. According to one aspect of the invention, the disclosed digital-to-analog converters comprise a master digital-to-analog converter that generates a master analog value, and a slave digital-to-analog converter that generates a slave analog value that is based on the master analog value. The analog values may be, for example, current values or voltage values. The slave analog value can be, for example, substantially proportional to the master analog value. In one exemplary implementation, the step size of the slave digital-to-analog converter is a fixed percentage of the master analog value.

According to another aspect of the invention, the master D/A converter can be varied during a coarse tuning mode, while the input to the slave D/A can be fixed, for example, to an approximately mid-range value until the master analog value satisfies one or more predefined conditions. Thereafter, during a fine tuning mode, the slave D/A converter can be varied, while the master D/A converter is fixed, so that the output Y is equal to a desired value (within a specified tolerance).

According to yet another aspect of the invention, the master digital-to-analog converter can optionally comprise a binary weighted digital-to-analog converter and the slave digital-to-analog converter can optionally comprise a thermometer encoded digital-to-analog converter.

A more complete understanding of the present invention, as well as further features and advantages of the present invention, will be obtained by reference to the following detailed description and drawings.

DETAILED DESCRIPTION

Figure 1:
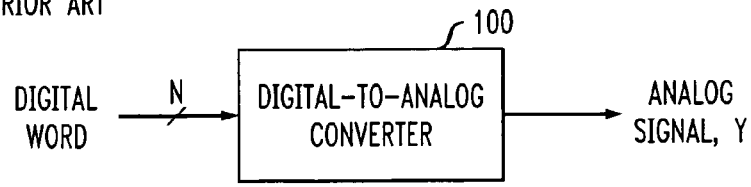
FIG. 1 is a block diagram of a conventional D/A converter.
Figure 2:
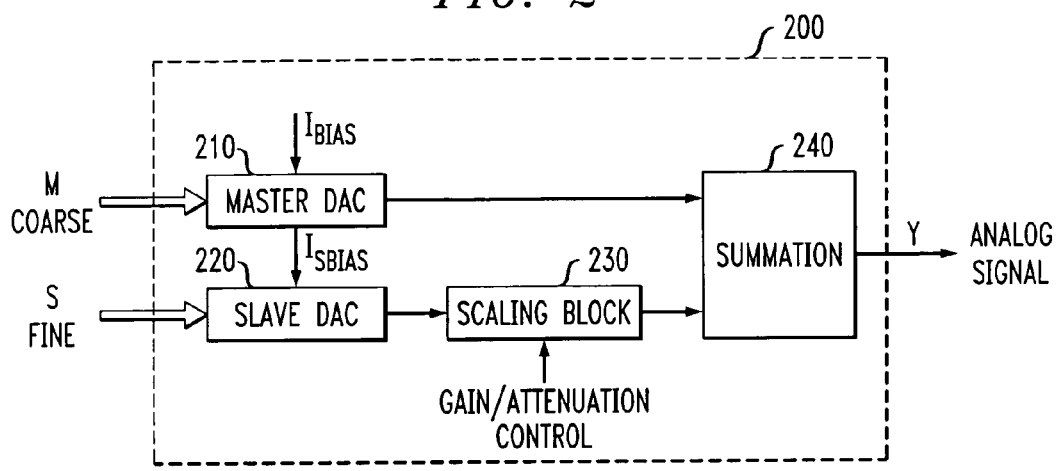
FIG. 2 is a block diagram of a master/slave digital-to-analog converter incorporating features of the present invention.

FIG. 2 is a schematic block diagram of a master/slave digital-to-analog converter 200 incorporating features of the present invention. As shown in FIG. 2, the master/slave D/A converter 200 comprises a master D/A converter 210 and a slave D/A converter 220. In the exemplary embodiment shown in FIG. 2, the D/A converter 210 and D/A converter 220 are both current-mode D/A converters. It will be recognized by one skilled in the art, however, that either or both converters 210, 220 could be implemented with voltage outputs, without departing from the scope of the invention. Further, the master D/A converter 210 may cover a broad range, such as 0-150 μA of current, while the slave D/A converter 220 covers a small percentage, such as +/−20%, of the master D/A converter value. The analog output of the D/A converter 200, Y, is generated by summation block 240, which sums the outputs of the D/A converters 210, 220, with the output of the slave D/A 220 scaled by a scaling block 230.

As shown in FIG. 2, bias currents, that determine the full-scale output value, and thus the size of the quantization level (i.e., step size) of each converter 210, 220, are input to the D/A converters 210 and 220. The master D/A converter 210 is biased by a fixed reference current, $I_{BIAS}$, while the slave D/A converter 220 is biased by a slave bias current, $I_{SBIAS}$, that is proportional to the master output current, $I_{MAST}$ (not shown in FIG. 2). Thus, each quantization step of the output current of the slave D/A converter 220 is substantially proportional to the output current of the master D/A converter 210. In one implementation, each step of the slave D/A converter 220 generates an output current that is a fixed percentage of the current value generated by the master D/A converter 210 over the entire output range of the master.

As shown in FIG. 2, the exemplary master/slave D/A converter 200 is driven by a circuit (not shown) that generates separate digital words to control the master and slave D/A converters 210, 220. Typically, each of the digital words controlling the master and slave D/A converters 210, 220 is less than N bits long. In one exemplary embodiment, the digital input to the master D/A converter 210 is varied during a coarse tuning mode, while the input to the slave D/A 220 is fixed. Then, the digital input to slave D/A converter 220 is varied during a fine tuning mode, while the input to master D/A 210 is fixed, so that the output Y is, within a specified precision, equal to a desired value. The master D/A converter 210 can be configured to hold its state after one or more predefined requirements are met (that define a coarse tuning). Then, the slave D/A converter 220, after being held at an appropriate mid-range value during the coarse tuning mode, can be configured for continuous fine tuning of the output with more precision than is possible with the master D/A converter 210. Such coarse and fine tuning modes might be used, for example, in a DLL, to first coarsely tune the delay of the underlying delay line, and then to fine tune the delay to align the phases of the input and the output of the delay line.

In this manner, the digital-to-analog converter 200 of the present invention efficiently provides both a wide operating range during a "coarse" locking mode, and a required level of precision during a "fine" locking mode.

As discussed further below in conjunction with FIG. 3, the output of the slave D/A converter 220, and thus both the range and step size of the D/A converter 200 in a fine tuning mode, can be scaled up or down by adjusting the gain or attenuation of the scaling stage 230. This provides a means to change the precision of the D/A 200 in a fine tuning mode without increasing the size or complexity of the slave D/A 220. For example, the effective step size of the slave D/A 220 can be reduced, at the expense of reduced output range in the fine tuning mode, by decreasing the gain of stage 230.

One embodiment of the present invention recognizes that a binary weighted current-mode D/A converter can introduce noise at major transitions in its input word (e.g., code 01111111 switching to 10000000 or vice versa). Generally, an N-bit binary weighted D/A converter is implemented using N current sources, each of which is controlled by one bit of the digital input word. Further, the current controlled by bit i is $2^i$ times the current controlled by the LSB, where i corresponds to 0 for the LSB and N−1 for the MSB. For example, in a three bit binary weighted D/A converter, the three current sources will have relative weights of 4, 2, and 1, respectively. When the digital input word is equal to 011, the two smallest current sources will be active, and summed together to form the output current. If the digital input word changes to 100, the two smallest current sources will turn off and the largest current source will turn on. If the current sources do not all turn on and off at precisely the same time, a noise spike will be present in the output.

It is well known in the literature that such noise spikes may be prevented by implementing the digital-to-analog converter using thermometer encoding. A thermometer-encoded N-bit D/A converter is comprised of $2^N-1$ equal valued current sources. Returning to the previous example, a three bit thermometer encoded D/A converter is comprised of seven current sources. In this manner, a single LSB change in the digital input word turns on or off only a single current source, thus avoiding the aforementioned noise spike. Note that the number of current sources, and thus the size and complexity of the converter, increases exponentially with the number of bits, N. Thus, the technique of thermometer encoding is used sparingly in low-cost D/A converter designs.

In one exemplary embodiment of the present invention, the master D/A converter 210 is embodied as a binary weighted D/A converter, and the slave D/A converter 220 is embodied as a thermometer encoded D/A converter.

The proposed master/slave D/A converter 200 reduces the overall D/A converter size and power. In addition, when implemented using the thermometer encoded slave D/A converter and binary weighted master D/A converter combination, the MSB switching noise inherent in binary encoded D/A converters will not be present in fine tuning mode.

Figure 3:
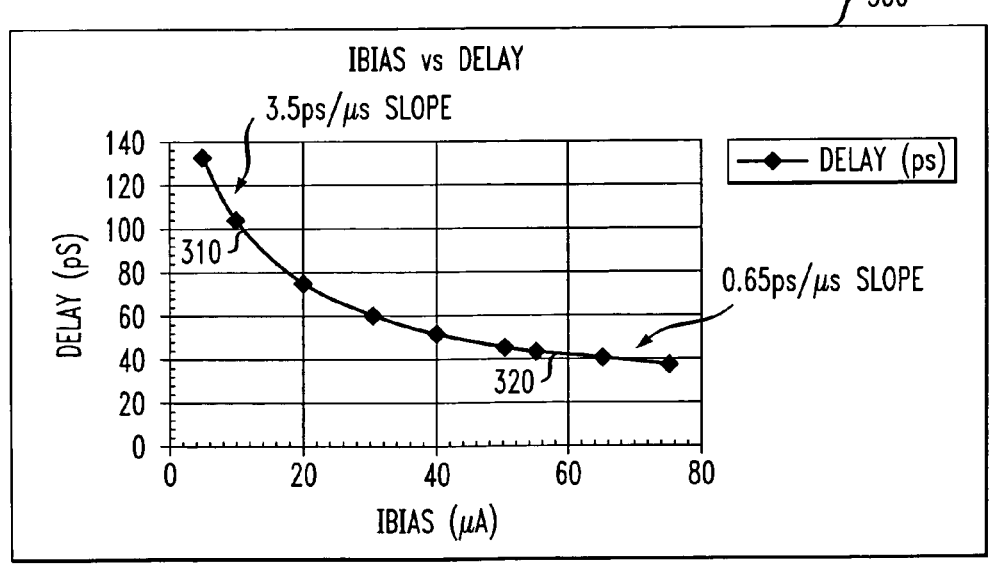
FIG. 3 is a Controlled Delay-Line transfer characteristic curve, illustrating the range of bias current required of a digital-to-analog converter.

FIG. 3 is a characteristic curve 300 illustrating the transfer characteristic of an electrical delay line, which has a time delay that is controlled by an input bias current. Generally, as the bias current is increased, the delay decreases in a non-linear manner. If the master/slave D/A converter 200 is used in this application to provide the bias current, then scaling stage 230 provides a means to linearize this characteristic. For example, in region 310 of the curve 300, the slope of the delay versus bias current curve is relatively steep, and thus the gain of stage 230 can be reduced. Similarly, in region 320 of the curve 300, the slope of the curve is relatively shallow, and thus the gain of stage 230 can be increased. In this manner, the gain/attenuation stage 230 allows for some linearization of the control loop properties.

Continuing the above example, where the master D/A converter 210 covers a broad range, such as 150 μA of current, and the slave D/A converter 220 covers a more narrow range, such as +/−20% of the master D/A converter value, a "multiply by 2" gain allows the slave D/A converter 220 to cover a larger range (+/−40%) of the master D/A converter value, while a "divide by 2" attenuation allows the slave D/A converter 220 to cover a smaller range (+/−10%) of the master D/A converter value.

At least a portion of the D/A converter of the present invention may be implemented in an integrated circuit. In forming integrated circuits, a plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A digital-to-analog converter, comprising:
    a master digital-to-analog converter that generates a master analog value, and
    a slave digital-to-analog converter that generates a slave analog value that is based on said master analog value, wherein said slave digital-to-analog converter has a plurality of steps that are substantially proportional to said master analog value and wherein said digital-to-analog converter has an output that is substantially equal to a sum of a first signal that is substantially proportional to said master analog value and a second signal that is substantially proportional to said slave analog value.

2. The digital-to-analog converter of claim 1, wherein said slave analog value is substantially proportional to said master analog value.

3. The digital-to-analog converter of claim 1, wherein said master digital-to-analog converter covers a broader range of analog values than said slave digital-to-analog converter.

4. The digital-to-analog converter of claim 1, wherein said slave digital-to-analog converter is biased by a signal that is proportional to said master analog value.

5. The digital-to-analog converter of claim 1, wherein each of said plurality of step sizes of said slave digital-to-analog converter is a fixed percentage of said master analog value.

6. The digital-to-analog converter of claim 1, wherein said slave analog value is held at approximately a mid-range value until said master analog value satisfies one or mote predefined conditions.

7. The digital-to-analog converter of claim 1, further comprising a scaling stage associated with said slave digital-to-analog converter.

8. The digital-to-analog converter of claim 1, wherein said master digital-to-analog converter comprises a binary weighted digital-to-analog converter.

9. The digital-to-analog converter of claim 1, wherein said slave digital-to-analog converter comprises a thermometer encoded digital-to-analog converter.

10. The digital-to-analog converter of claim 1, wherein said analog values are current values.

11. The digital-to-analog converter of claim 1, wherein said analog values are voltage values.

12. A method for digital-to-analog conversion, comprising:
    generating a master analog value based on a digital input, and
    generating a slave analog value that is based on said master analog value, wherein said slave digital-to-analog converter has a plurality of steps that are substantially proportional to said master analog value and wherein said digital-to-analog conversion has an output that is substantially equal to a sum of a first signal that is substantially proportional to said master analog value and a second signal that is substantially proportional to said slave analog value.

13. The method of claim 12, wherein said slave analog value is substantially proportional to said master analog value.

14. The method of claim 12, further comprising the step of holding said slave analog value at approximately a mid-range value until said master analog value satisfies one or more predefined conditions.

15. The method of claim 12, further comprising the step of scaling said slave analog value.

16. The method of claim 12, wherein said analog values are one or more of current values or voltage values.

17. An integrated circuit, comprising:
    a digital-to-analog converter comprising:
    a master digital-to-analog converter that generates a master analog value, and
    a slave digital-to-analog converter that generates a slave analog value that is based on said master analog value, wherein said slave digital-to-analog converter has a plurality of steps that are substantially proportional to said master analog value and wherein said digital-to-analog converter has an output that is substantially equal to a sum of a first signal that is substantially proportional to said master analog value and a second signal that is substantially proportional to said slave analog value.

18. A digital-to-analog converter, comprising:
    a master digital-to-analog converter that generates a master analog value, and
    a slave digital-to-analog converter that generates a slave analog value that is based on said master analog value, wherein said master analog value becomes substantially fixed upon detection of a predefined condition and wherein said slave analog value continues to vary.

19. A method for digital-to-analog conversion, comprising:
    generating a master analog value based on a digital input, and
    generating a slave analog value that is based on said master analog value, wherein said step of generating a slave analog value generates a slave analog value in which the quantization step size of said slave analog value is a fixed percentage of said master analog value.

20. A method for digital-to-analog conversion, comprising:
    generating a master analog value based on a digital input, and
    generating a slave analog value that is based on said master analog value, wherein said master analog value becomes substantially fixed upon detection of a predefined condition and wherein said slave analog value continues to vary.

* * * * *

UNITED STATES PATENT AND TRADEMARK OFFICE
CERTIFICATE OF CORRECTION

PATENT NO. : 7,352,313 B2  
APPLICATION NO. : 11/141498  
DATED : April 1, 2008  
INVENTOR(S) : Christopher J. Abel Page 1 of 1

It is certified that error appears in the above-identified patent and that said Letters Patent is hereby corrected as shown below:

In claim 6, column 5, line 50, "mote" should be replaced by -- more --.

Signed and Sealed this
Eleventh Day of December, 2012

David J. Kappos
*Director of the United States Patent and Trademark Office*